United States Patent [19]

Jex

[11] Patent Number: 5,506,803
[45] Date of Patent: Apr. 9, 1996

[54] APPARATUS AND METHOD FOR MINIMIZING VERIFY TIME IN A SEMICONDUCTOR MEMORY BY CONSTANTLY CHARGING N-WELL CAPACITANCE

[75] Inventor: Jerry G. Jex, Forest Grove, Oreg.

[73] Assignee: Intel Corporation, Santa Clara, Calif.

[21] Appl. No.: 361,872

[22] Filed: Dec. 22, 1994

Related U.S. Application Data

[63] Continuation of Ser. No. 861,473, Apr. 1, 1992, abandoned.

[51] Int. Cl.$^6$ .................................................. G11C 16/06
[52] U.S. Cl. ..................... 365/185.23; 365/230.06; 365/189.09; 365/185.22; 326/82; 326/108
[58] Field of Search ........................ 395/425, 430; 365/185, 189.01, 218, 230.06, 900; 307/449, 463; 326/105, 106, 108, 82

[56] References Cited

U.S. PATENT DOCUMENTS

| | | | |
|---|---|---|---|
| 4,782,247 | 11/1988 | Yoshida et al. | 326/81 |
| 4,860,261 | 8/1989 | Kreifels et al. | 365/218 |
| 4,875,188 | 10/1989 | Jungroth | 365/185 |
| 4,916,334 | 4/1990 | Minagawa et al. | 326/103 |
| 5,038,327 | 8/1991 | Akaogi | 365/230.06 |
| 5,039,882 | 8/1991 | Arakawa | 326/106 |
| 5,214,606 | 5/1993 | Hashimoto | 365/218 |
| 5,265,052 | 11/1993 | D'Arrigo et al. | 365/189.09 |

Primary Examiner—Glenn Gossage
Attorney, Agent, or Firm—Blakely, Sokoloff, Taylor & Zafman

[57] ABSTRACT

An apparatus and method are described for minimizing the time required to perform verify operations in a semiconductor memory having a memory cell capable of being programmed, erased, and repaired, such as a flash EEPROM (electrically erasable programmable read only memory). The apparatus minimizes the time required to verify that the memory cell was correctly programmed, erased, and repaired. The apparatus includes a word a decoder, a driver, and a means for switching voltage levels supplied to the decoder and driver. The driver is comprised of a p-channel transistor having an n-well electrically coupled to a first power line, and a p-substrate. When the memory cell is to be accessed, the driver is activated and drives the word line with a voltage on a second power line. The the second power line is switched from a first voltage level to a second voltage level in order to initiate a verify process while the first power line is maintained at an approximately constant voltage. Any inherent diffusion junction capacitance between the n-well and the p-substrate is kept substantially at a constant charge. By coupling the driver n-well capacitive load to the first power line, there is no need to wait for the driver n-well capacitance to discharge between program and program verify operations. Thereby, the amount of time required to perform a program verify is minimized.

5 Claims, 4 Drawing Sheets

FIG_1 (PRIOR ART)

FIG_5

APPARATUS AND METHOD FOR MINIMIZING VERIFY TIME IN A SEMICONDUCTOR MEMORY BY CONSTANTLY CHARGING N-WELL CAPACITANCE

This is a continuation of application Ser. No. 07/861,473, filed Apr. 1, 1992, now abandoned.

FIELD OF THE INVENTION

The present invention pertains to the field of nonvolatile semiconductor memories. More particularly, the present invention relates to reducing the time required to perform a verification during program verify, pre-erase verify, and post-erase-repair verify operations associated with programming and erasing a nonvolatile semiconductor memory.

BACKGROUND OF THE INVENTION

Computer memory typically can be divided into two categories: volatile and nonvolatile. Nonvolatile memories retain their data after power is removed. Volatile memory devices retain their data only as long as power is applied.

One type of prior nonvolatile semiconductor memory is the flash electrically erasable programmable read-only memory ("flash EEPROM"). The flash EEPROM can be programmed by a user, and once programmed, the flash EEPROM retains its data until erased. After erasure, the flash EEPROM can be reprogrammed with new data. The same flash EEPROM is typically capable of being cycled (i.e., erased and reprogrammed) thousands of times.

A flash EEPROM is typically comprised of banks of memory cells. Data is stored as digital bits (0's and 1's) in these memory cells with each cell storing one bit of data.

Each individual memory cell within a memory bank typically is indexed by a pair of select lines designated as X-select and Y-select. The X-select word lines specify the row and the Y-select bit lines specify the column of a particular memory cell to be accessed. Decode circuitry is used to interpret input control signals and activate the appropriate select lines to access the desired memory cells.

The verify signals for the decode circuitry are precision voltages controlled over temperature and process skews and are typically generated by a class-A type amplifier, which typically is a weak driver. Consequently, the output signals typically do not have enough current to properly drive the select lines, which typically can have up to five picofarads of capacitance each, depending on their length. Relatively large Complementary Metal Oxide Semiconductor ("CMOS") inverters are typically used to drive the select lines. The CMOS inverters buffer weak decoder output signals from having to drive the large load on the select lines. By driving the appropriate combination of X and Y-select lines, a particular memory cell within a memory cell bank can be accessed.

Figure 1:
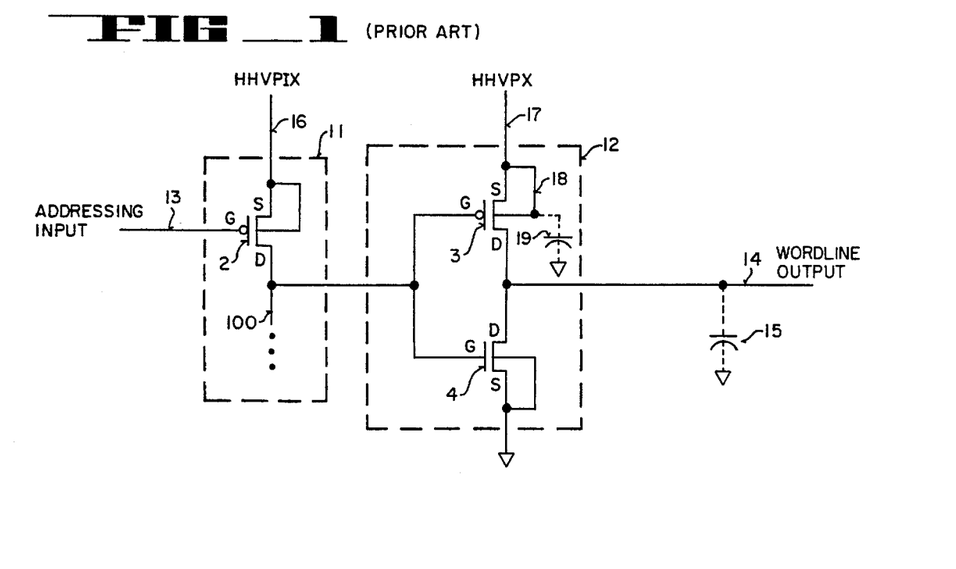
FIG. 1 is a circuit diagram of one prior art decoder and driver.

A typical prior decoder 11 and CMOS driver 12 circuit is shown in FIG. 1. CMOS driver 12 is a CMOS inverter. A control signal is applied as an input on line 100. The decoder 11 receives a logical high addressing input at the gate of transistor 2, and a logical low control signal on line 100, which in turn activates driver 12 to drive word line if the word line is selected 14. Word line 14 has a certain amount of associated capacitance. This capacitance results from the length of word line 14 and the number of flash cells attached to word line 14. This capacitance is depicted in dashed lines as capacitor 15 in FIG. 1. Decoder 11 is a p-channel transistor 2 and is powered by a high voltage line HHVPIX 16. Typical voltages for HHVPIX 16 are 12 volts ($V_{pp}$) and 5 volts ($V_{cc}$). $V_{pp}$ is the erase/program power supply voltage for the flash memory, and $V_{cc}$ is the device power supply.

Driver 12 is comprised of a p-channel transistor 3 and an n-channel transistor 4. Driver 12 is powered by HHVPX 17, which is a high voltage line. The voltage levels on HHVPX 17 vary, depending on the function to be performed. Typical voltage levels and functions for HHVPX 17 are 12 volts ($V_{pp}$) for programming, 5 volts ($V_{cc}$) for read and standby, 7 volts for program verify, 7 or 5 volts for pre-erase verify, 5 to 10 volts for post-erase-repair, and 2.5 volts for post-erase-repair verify. As an example, to program a memory cell, HHVPX needs to be set to 12 volts ($V_{pp}$). A program verify will automatically follow the program step in order to check that the programming was performed satisfactorily. HHVPX 17 needs to be changed to 7 volts in order to perform the program verify.

The p-channel transistor 3 of driver 12 resides in an n-well. In order to keep the p-n junction reverse biased to prevent latch-up, the n-well typically is biased at a voltage level that is greater than or equal to the program voltage. This typically is accomplished by tying the n-well to HHVPX 17 as shown by line 18 in FIG. 1.

One problem with the configuration of FIG. 1 is the relatively large capacitance inherent in the diffusion junction between the n-well and the p-substrate for driver 12. Because each word line has a separate driver, the parallel combination of junction capacitances creates a large lumped capacitance. This inherent n-well capacitance is shown in FIG. 1 as capacitor 19.

The n-well capacitance 19 typically detrimentally affects the amount of time required to verify for the different stages. The verify voltages are typically generated by a class-A type amplifier, which provides a precision reference voltage controlled over temperature and process skews. Class-A type amplifiers are typically weak drivers. A relatively long time is typically required to charge and discharge the n-well capacitance 19 whenever the HHVPX voltage level changes (e.g., 12 volts for program versus only 7 volts for program verify). This translates into a longer period of time to perform verifies because the n-well capacitance 19 must be charged and discharged by the weak amplifier.

In the past, memory capacity was relatively small and there were relatively few drivers for driving the memory cells so that the combined effect of the n-well capacitance on the drivers was relatively small. Thus, there was a relatively minor impact on the time required to verify at the different stages.

As memory capacity has increased, however, the cumulative n-well capacitance has correspondingly increased. The n-well capacitance significantly increases the time for verifies for larger flash EEPROMs. Of course, a longer verify time adversely affects the performance of a flash EEPROM.

Another disadvantage of certain prior flash EEPROMs is that HHVPX generators and verify level generators need to be relatively large and powerful in order to supply enough current to drive capacitively loaded word lines. This typically is a result of the n-well capacitance inherent in the drivers.

SUMMARY AND OBJECTS OF THE INVENTION

One object of the present invention is to improve the response time of semiconductor memories.

Another object of the present invention is to improve the response time of flash EEPROMs.

Another object of the present invention is to minimize the time required to verify that operations such as program, erase, and post-erase repair have been performed correctly.

Another object of the present invention is to decouple the n-well capacitance of a driver from the voltage supply of the driver.

Another object of the present invention is to maintain the n-well capacitance of a driver in a charged state as a verification process is initialized.

An apparatus is described for a semiconductor memory having a memory cell capable of being programmed, erased, and repaired. The apparatus minimizes the time required to verify that the memory cell was correctly programmed, erased and repaired. The apparatus includes a word line, a driver, a decoder and a means for switching voltage levels supplied to the decoder and driver. The word line provides access to the memory cell. The word line is selected when an address corresponding to the memory cell is decoded. The driver is comprised of a p-channel transistor having an n-well electrically coupled to a first power line and a p-substrate. When the memory cell is to be accessed, the driver is activated and drives the word line with a voltage on a second power line. The means for switching switches the second power line from a first voltage level to a second voltage level in order to initiate a verify process while the first power line is maintained at an approximately constant voltage. Any inherent diffusion junction capacitance between the n-well and the p-substrate is kept substantially at a constant charge.

Other objects, features, and advantages of the present invention will be apparent from the accompanying drawings and from the detailed description that follows below.

BRIEF DESCRIPTION OF THE DRAWINGS

The present invention is illustrated by way of example and not by way of limitation in the figures of the accompanying drawings, in which like references indicate similar elements, and in which.

DETAILED DESCRIPTION

Figure 2:
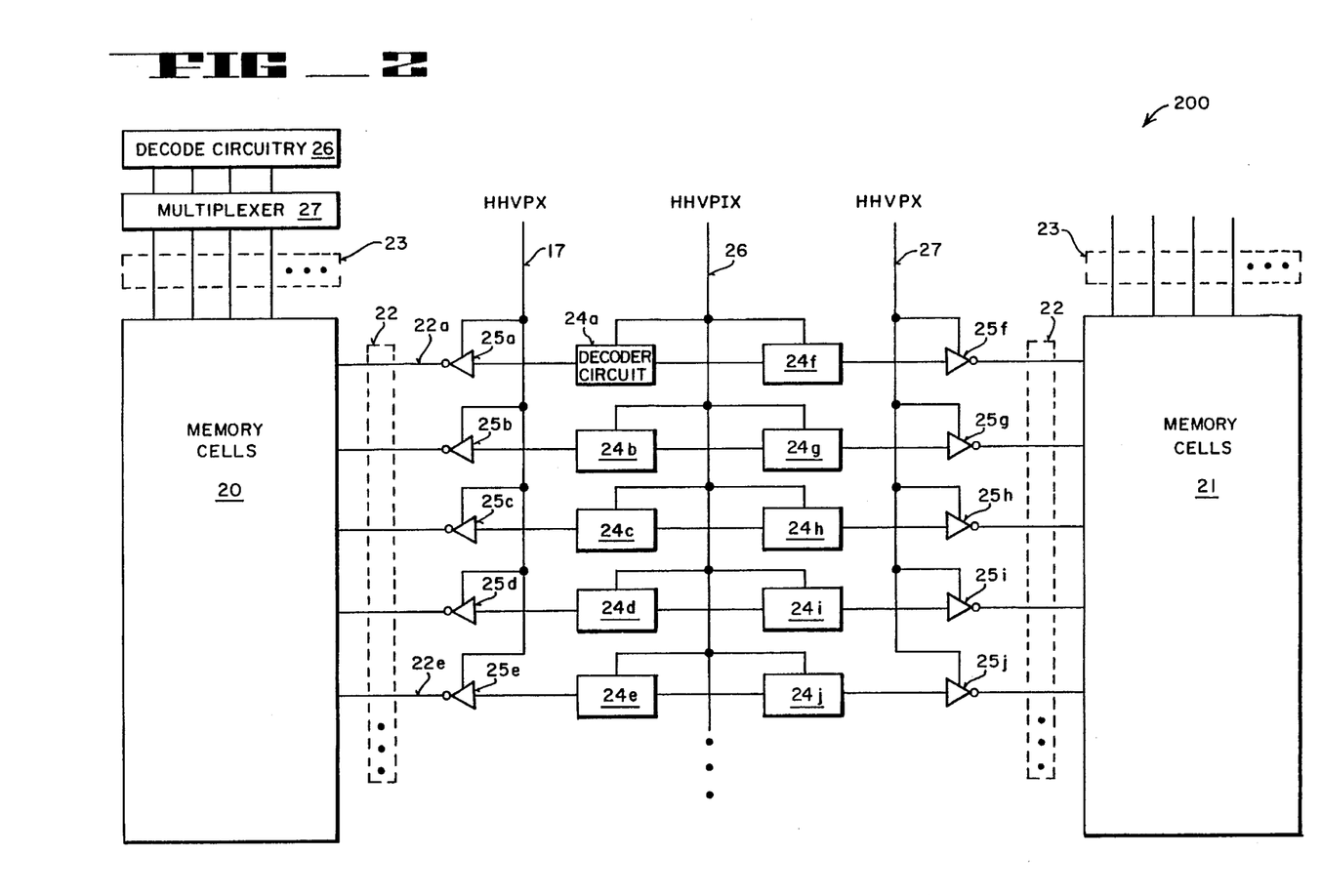
FIG. 2 is a block diagram illustrating memory banks, decoders, and a driver.

FIG. 2 is an illustration of a relevant portion of a flash EEPROM 200. Data is stored as a digital bits (0's and 1's)in memory cells that are arranged in arrays. For the sake of clarity, only two memory arrays of memory cells—namely, a left array 20 and a right array 21—are shown in FIG. 2 and discussed below.

As described in more detail below, one embodiment of the present invention minimizes the amount of time required to perform verifies by decoupling n-well capacitance of a flash EEPROM driver from a voltage supply for the driver. Hence, as the voltage of the driver is varied to initiate the verification processes, the response time is minimized because the n-well capacitance need not be charged or discharged.

Each individual memory cell is indexed by a pair of select lines designated as the X and Y-select. The X-select word lines 22 specify the row of a particular memory cell to be accessed. The Y-select bit lines 23 specify the column of a particular memory cell to be accessed.

In order to determine which of these select lines are to be activated for accessing particular memory cells, the flash EEPROM includes decode circuitry. Decode circuits 24a–j associated with the X-select word lines 22 are shown. The flash EEPROM also includes decode circuitry 26 for decoding which of the Y-select bit lines 23 are to be accessed.

The output from the Y-select decode circuitry 26 is fed into multiplexer 27, which activates the appropriate Y-select word line 23.

The verify output signals from the X-select decode circuits 24a–j are generated by class-A type amplifiers. Class-A type amplifiers are generally weak drivers. By themselves, the class-A type amplifiers of the decode circuits would have problems driving the word lines because the word lines have inherent associated capacitance. The longer the word line and the more flash cells that are attached, the more inherent capacitance is associated with the word line. Each word line has approximately 5 picofarads of capacitance. Consequently, the decode circuits 24a–j lack enough current to properly drive the X-select word lines 22.

Because of this, drivers 25a–j are used to drive the X-select word lines. For one embodiment of the present invention, drivers 25a–j are relatively large CMOS inverters.

The following is an example of an access. In order to access the top row of memory cells of memory bank 20, decode circuit 24a outputs a signal to driver 25a which drives the top X-select word line, thereby accessing the memory cells corresponding to that row. In order to access a particular column, the Y-select decode circuitry 26 outputs a signal instructing multiplexer circuitry 27 to activate the desired Y-select bit line 23.

The functions to be performed on the accessed memory cell depend on the voltages on HHVPX 27 and HHVPIX 26. HHVPX 27 and HHVPIX 26 are high power lines. HHVPX 27 supplies power to the drivers 25a–j. For one embodiment, HHVPX 27 switches among several voltage levels, depending upon the function to be performed. In order to read the data stored on the memory cells, HHVPX 27 is set at $V_{cc}$. Prior to programming a memory cell, a pre-program function is performed. The pre-program function is used to prevent over-erasure of the memory cell. HHVPX 27 is set at 12 volts for the pre-program function. Next, a pre-program verify function is performed to verify that the pre-program was performed correctly. HHVPX 27 is set at either 5 or 7 volts for the pre-program verify function. For programming the memory cells, HHVPX 27 is set at $V_{pp}$. $V_{pp}$ is the power supply voltage for the flash memory and is a constant 12 volts. $V_{cc}$ is the device power supply and is approximately a constant 5 volts.

Immediately following the programming of the memory cells, a test is performed to determine whether the programming was performed correctly. This is known as a "program verify." HHVPX 27 is set to approximately 7 volts during program verify. If a fault is detected during programming verify, the program operation is repeated.

In order to erase the memory cells, HHVPX 27 is set at Vcc (i.e., 5 volts). Occasionally, one or more memory cells become "overerased." This causes a failure known as "erase leak problem." Under such circumstances, a post-erase repair is performed. HHVPX 27 is set anywhere from 5 to 10 volts during a post-erase repair. The post-erase repair is then verified. HHVPX 27 is set at 2.5 volts during the post-erase repair verify.

HHVPIX 26 powers the decode circuitry. For one embodiment, HHVPIX 26 switches between two voltage levels—namely, $V_{pp}$ (12 volts) and $V_{cc}$ (5 volts). HHVPIX 26 is set to $V_{pp}$ during the pre-program, pre-program verify, program, program verify, post-erase repair, and post-erase repair verify functions or operations. HHVPIX 26 is set at $V_{cc}$ during the read, erase, and erase verify functions. Table 1 below shows the voltages for HHVPX and HHVPIX for the different functions or operations.

TABLE 1

| FUNCTION | HHVPX | HHVPIX |
|---|---|---|
| Read | $V_{cc}$ (5 V) | $V_{cc}$ |
| Pre-Program | 12 V | $V_{pp}$ |
| Pre-Program Verify | 5 or 7 V | $V_{pp}$ |
| Program | $V_{pp}$ (12 V) | $V_{pp}$ |
| Program Verify | 7 V | $V_{pp}$ |
| Erase | $V_{cc}$ | $V_{cc}$ |
| Erase Verify | $V_{cc}$ | $V_{cc}$ |
| Post-Erase Repair | 5 V–10 V | $V_{pp}$ |
| Post-Erase Repair Verify | 2.5 V | $V_{pp}$ |

For one embodiment, each memory array is broken into 128 blocks of memory. Seven address lines are used to select between the 128 memory blocks. Each memory block is further comprised of 16 rows of memory cells. To select a particular row, one must first access the particular memory block in which the row resides and then select among the sixteen rows of memory cells in that block.

Figure 3:
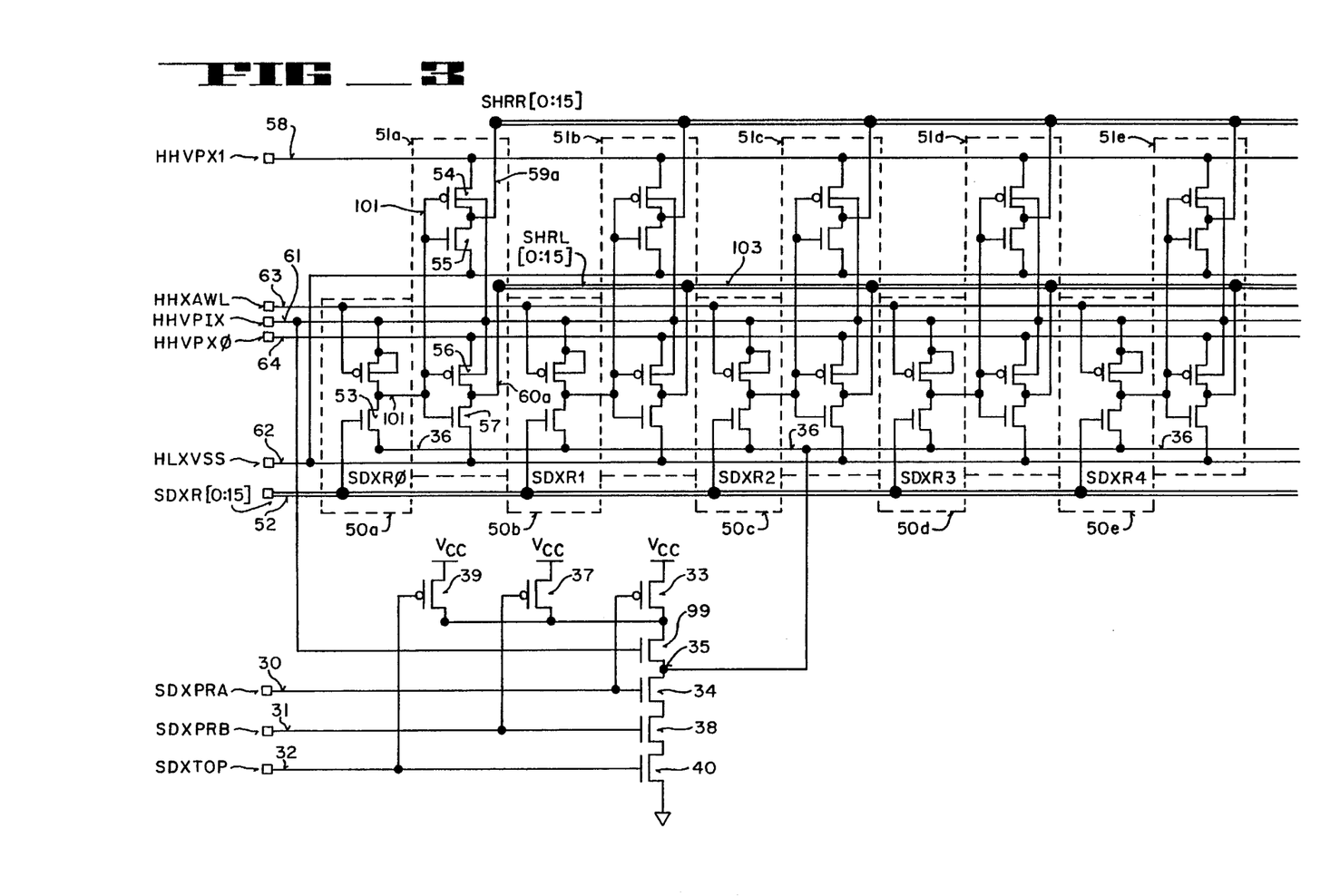
FIG. 3 is a schematic illustrating X-select decoder and driver circuits.

FIG. 3 is a schematic diagram which shows a relevant portion of the X-select decode and driver circuits for accessing one particular memory block. Although each memory block has 16 sets of X-select decoders and drivers (one set for each of the 16 rows), only five sets of the X-select decoders 50a–e and five sets of drivers 51a–e are shown. The other 11 decoder/driver sets have identical configurations as the five sets that are shown.

Pre-decode circuitry (not shown) decodes the seven address lines and generates three control signals SDXPRA 30, SDXPRB 31, and SDXTOP 32. The gate of transistor 99 is tied to the voltage HHVPIX 61 and therefore it is conductive whenever HHVPIX is at VCC or VPP and node 35 is in a low state. If SDXPRA 30 is in a low state (e.g., 0 volts), then transistor 33 is turned on and node 35 is pulled high (e.g., 5 volts). When node 35 is pulled high, this causes line 36 to also be pulled high. Each of the sixteen X-select decode circuits are disabled. Likewise, if SDXPRB 31 is in a low state, transistors 37 and 99 are turned on, which pulls node 35 high. Pulling node 35 high in turn causes line 36 to also be pulled high which disables each of the sixteen X-select decoders. If SDXTOP 32 is in a low state, transistors 39 and 99 are turned on, which pulls node 35 high. Pulling node 35 high in turn causes line 36 to also be pulled high, which disables each of the sixteen X-select decoders. Control signals SDXPRA 30, SDXPRB 31, and SDXTOP 32 must all be in a high state so as to enable the sixteen X-select decoders, which pulls node 35 low, thereby providing access to that particular memory block.

Once SDXPRA 30, SDXPRB 31, and SDXTOP 32 are all in a high state, transistors 34, 38, and 40 pull down nodes 35 and 36. This in turn enables the sixteen X-select decoders. SDXR [0:15] 52 selects which of the sixteen X-select decoders to activate. SDXR [0:15] 52 is comprised of sixteen lines (i.e., lines SDXR0 through SDXR15). SDXR0 is the first line and is used to access the first row of memory cells. SDXR1 is the second line and is used to access the second row of memory cells, etc. A high signal on any of the sixteen SDXR [0:15]lines activates the corresponding X-select decode and driver circuits. For example, if SDXR0 is set high, transistor 53 is turned "on," which causes node 101 to go low. This in turn causes transistors 54 and 56 in driver 51a to be activated. The first driver is comprised of transistors 54 and 55. This driver passes the voltage on HHVPX1 58 to SHRR0 59a. The SHRR0 line accesses the first memory cell row in the right array. As discussed above, the function to be performed on this row depends on the voltage of HHVPX1 58 (e.g. 5 volts for "read", 12 volts for program, etc.). The second driver is comprised of transistors 56 and 57. This driver passes the voltage on HHVPX0 64 to SHRL0 60a. The SHRL0 60a line accesses the first memory cell row in the left array. As discussed above, the function to be performed on this row depends on the voltage of HHVPX0 64.

In short, seven address lines are used to enable one out of 128 memory blocks. These seven address lines are pre-decoded so that only three control lines (e.g. SDXPRA 30, SDXPRB 31, and SDXTOP32) need be run to each block. If all three control lines are set high, that particular block is activated. Sixteen access lines (e.g. SDXR [0:15] 52) are used to activate one of sixteen pairs of drivers. Each pair of drivers drive a right and a left X-select word line. Depending on the HHVPX voltage passed to the memory cells, certain functions (e.g., read, program, erase, verify, etc.) are performed on that row of memory cells.

HHVPIX 61 is a high voltage line that supplies power to the X-select decode circuits. HLXVSS 62 is used for special test mode. For normal flash EEPROM operation, HLXVSS 62 is grounded. HLXVSS 62 is set at Vpp when the flash EEPROM is being operated in special test mode. HHXAWL 63 is used to balance the load on the drivers.

Figure 4:
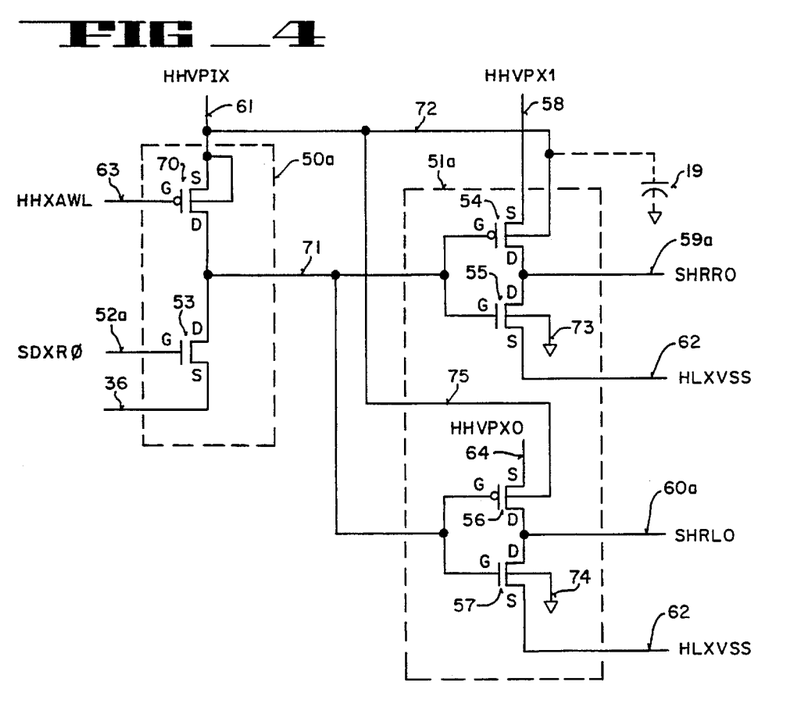
FIG. 4 is a circuit diagram of an X-select decoder and a driver.

FIG. 4 is a more detailed circuit diagram of an X-select decoder 50a and a single driver 51a. For one embodiment, X-select decoder 50a is comprised of a p-channel transistor 70 and an n-channel transistor 53. The source of transistor 70 is coupled to HHVPIX 61, which supplies the power to decoder 50a. The gate of transistor 70 is coupled to HHXAWL 63 (to balance the load on the driver 51a). The drain of transistor 70 is coupled to the drain of transistor 53 and also coupled to the gates of all four transistors 54–57 of driver 51a. The gate of transistor 53 is coupled to SDXR0 52a, which is the first of sixteen lines of SDXR [0:15] 52. The SDXR0 52a line corresponds to the first of sixteen rows of memory cells of that particular memory block. The source of transistor 53 is coupled to line 36. Line 36 determines whether that particular memory block is to be accessed.

To access the first row of the memory block corresponding to FIG. 4, line SDXR0 52a is set to a high state (e.g. 5 volts) and line 36 is pulled low. When this happens, the two drivers of 51a are activated. Gates 54 and 56 turn on and pull lines SHRR0 59a and SHRL0 60a high to HHVPX1 58 and HHVPX0 64. The output of decoder 50a, line 71 controls the activation and deactivation of the drivers 51a.

The first driver is comprised of transistors 54 and 55. The second driver is comprised of transistors 56 and 57. Transistor 54 is a p-channel device, and transistor 55 is an n-channel device. Both drivers have the same configuration and operate in the same manner.

The source of transistor 54 is coupled to HHVPX 1 58, which supplies power to the first driver. The gates of transistors 54 and 55 are coupled together and also coupled to the output 71 of the decoder 50a. The drains of transistors 54 and 55 are coupled together. The source of transistor 55 is coupled to HLXVSS which is normally grounded.

The source of transistor 56 is coupled to HHVPX0 64. The gates of transistors 56 and 57 are coupled together and also coupled to the output 71 of the decoder 50a. The source of transistor 57 is coupled to HLXVSS 62, which is normally grounded.

The n-diffusions of transistors 55 and 57 reside in p-substrate. In order to prevent latch-up, their p-n junctions are reverse biased. In other words, the p-substrate needs to be biased at a voltage level which is lower than or equal to the n-diffusion voltage. For one embodiment, this is accomplished by lines 73 and 74 which couple the p-substrate of transistors 55 and 57 to ground.

The diffusions of transistors 54 and 56 reside in n-wells. In order to prevent latch-up, their p-n junctions should be reverse biased (i.e., the n-well needs to be biased at a voltage level which is higher than or equal to the diffusion voltage). This is accomplished by coupling the n-wells of transistors 54 and 56 to HHVPIX 61, rather than HHVPX1 58. Lines 72 and 75 couple the n-wells of transistor 54 and 56, respectively, to HHVPIX 61. The significance of coupling the n-wells of transistor 54 and 56 to HHVPIX 61 instead of HHVPX1 58 is explained below.

Figure 5:
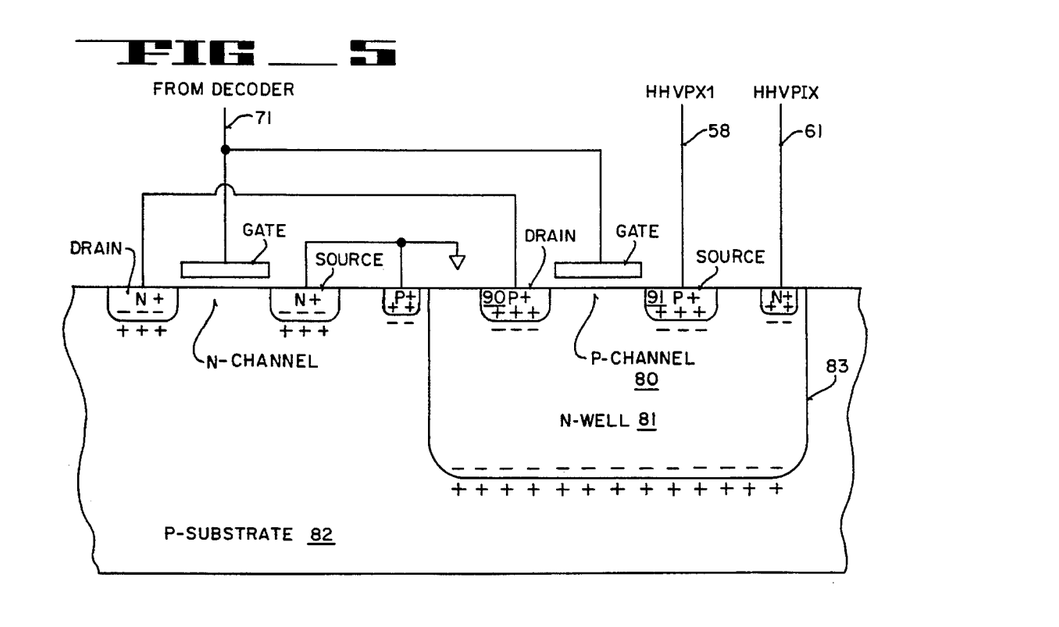
FIG. 5 is a cross-sectional illustration of a driver, including the substrate and circuit interconnects.

FIG. 5 is a cross-sectional illustration of the first driver of 51a including the substrate and circuit interconnects. The driver is fashioned by known CMOS processes. It can be seen from FIG. 5 that the p-channel 80 is in an n-well 81. The n-well 81 is biased at a voltage level which is higher than or equal to the voltage level of the p diffusions 90 and 91. Otherwise, the p-n junctions between diffusion 90 and n-well 81 and between diffusion 91 and n-well 81 may not be forward biased and serious latch-up conditions may occur.

One embodiment addresses potential latch-up problems by coupling n-well 81 to HHVPIX 61 in order to keep the p-n junctions between diffusion 90 and n-well 81 and between diffusion 91 and n-well 81 reverse biased. With this configuration, however, care must be taken to keep the p-n junctions reverse biased at all times by ensuring that the HHVPIX 61 voltage rises faster or at least as fast as the HHVPX1 58 voltage. In addition, care must be taken to ensure that the HHVPIX 61 voltage is lowered faster or at least as fast as the HHVPX1 58 voltage. The HHVPIX 61 voltage must be always kept greater than or equal to the HHVPX1 58 voltage. Known signal sequencing and/or high-voltage detector protection circuitry may be used to ensure that the HHVPIX 61 voltage is always kept greater than or equal to the HHVPX1 58 voltage.

Associated with each of the junctions between the positively charged p-doped regions and the negatively charged n-doped regions are certain amounts of inherent capacitance. This is represented in FIG. 5 by the + and − marks. Generally, the larger the junction area, the larger the associated capacitance. The largest inherent capacitance is typically at the diffusion junction 83 between the n-well 81 and the p-substrate 82.

Referring back to FIG. 4, this inherent capacitance at the diffusion junction between the n-well 81 and the p-substrate 82 is represented by capacitor 19 which is coupled across line 72 to ground. Because a large number of word lines are required to access large memory arrays and each word line requires a driver in order to properly drive the word line, a typical flash EEPROM has numerous drivers. Each driver has an n-well capacitance 19 inherent with the diffusion junction of the n-wells to p-substrate. Because of the large number of drivers, the cumulative capacitance inherent with these drivers is relatively large. Typical n-well capacitance attributed to the drivers for an 8 megabyte flash EEPROM is approximately 300 picofarads. A relatively long time is required to charge and discharge such a large capacitor.

For one embodiment of the present invention, the voltage level of HHVPIX 61 remains constant at $V_{pp}$ (12 volts) during both program and program verify stages. Because the n-wells of the drivers are coupled to HHVPIX 61, the inherent capacitance associated with the drivers remains charged when the flash EEPROM switches from program mode to the program verify mode. By coupling the driver n-well capacitive load to HHVPIX 61, there is no need to wait for the driver n-well capacitance to discharge between program and program verify. The amount of time required to perform a program verify is thereby minimized.

Note that the present invention does not shorten the time required to charge or discharge the n-well capacitance 19. Rather, by coupling the n-well capacitance 19 to HHVPIX 61 (which remains at 12 volts during both program and program verify operations), capacitor 19 remains fully charged for both program and program verify modes. Thus, there is no need to wait for capacitor 19 to charge up or discharge as the flash EEPROM cycles from the program mode to the program verify mode. As a result, the time required to program and verify the programming of the cell is minimized.

Coupling the drivers' n-wells to HHVPIX 61 does not affect the HHVPX0 64 and HHVPX1 58 voltages passed to the word lines through the drivers. The HHVPX0 64 voltage is coupled to the source of transistor 56. The HHVPX1 58 voltage is coupled to the source of transistors 54 and 59a. Hence, the HHVPX0 voltage is properly passed to SHRL0 60a.

Likewise, capacitance 19 is kept charged during the post-erase repair and the post-erase repair verify operations by HHVPIX 61, which remains at $V_{pp}$ (12 volts) for these two operations. Meanwhile, HHVPX0 64 and HHVPX1 58 are coupled to the sources of transistors 54 and 56, and HHVPX0 64 and HHVPX1 58 switch from 5–10 volts down to 2.5 volts. This drives word lines 59a and 60a to 2.5 volts. Because capacitor 19 is not required to be discharged, the time for performing post-erase repair and post-erase repair verifies is minimized.

Figure 6:
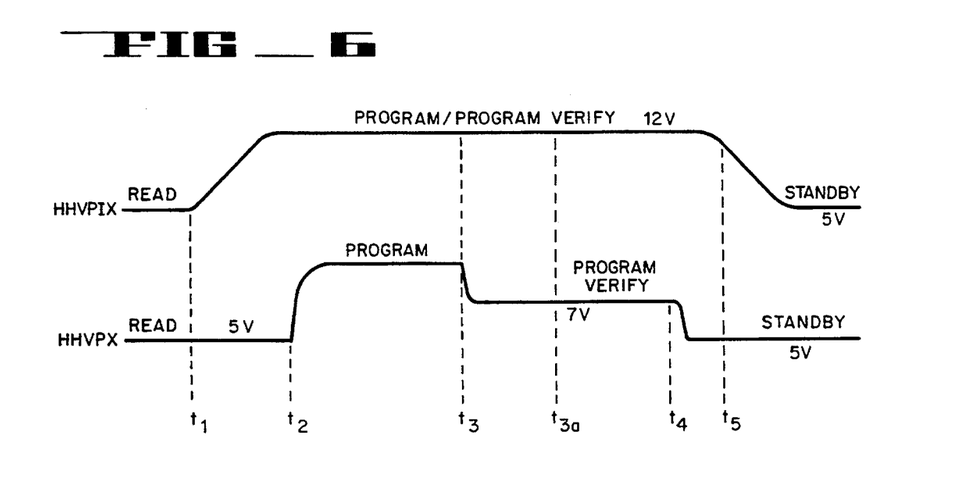
FIG. 6 is a timing diagram illustrating the relative timing and voltage levels for HHVPIX and HHVPX during program and program-verify modes.

FIG. 6 is a timing diagram for one embodiment of the present invention showing the relative timing and voltage levels for HHVPIX and HHVPX during program and program verify modes following a read operation. For the read operation, both HHVPIX and HHVPX are at 5 volts. When the program operation is initiated at $t_1$, HHVPIX rises to 12 volts. A short time later, at $t_2$, HHVPX rises to a program level of 12 volts. From $t_2$ to $t_3$, the potion of the memory array that was selected and decoded is being programmed to store new data. At $t_3$, the program operation has been completed, and a program verify is initiated to check that the flash EEPROM had been properly programmed. In order to perform the program verify, HHVPX is lowered from 12 volts to 7 volts. HHVPIX remains at 12 volts, however, for the program verify operation. From $t_{3a}$ to $t_4$, the program verify operation is being performed. If, after completion of the program verify, it had been determined that the memory array had been properly programmed, the flash EEPROM can be put into a standby mode. In standby, HHVPIX and HHVPX are both lowered to Vcc (5 volts). Note that by lowering the HHVPIX voltage at $t_5$, HHVPIX is kept at a higher or equal voltage than HHVPX, which keeps the drivers' p-n junctions reverse biased to prevent latch-up problems.

Thus, an apparatus and method for minimizing the amount of time required to perform verifies for different stages in a flash EEPROM is described.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A fast driver for driving a voltage on a select line of a memory array, comprising:
    (A) an n-channel transistor having
        (1) a drain terminal coupled to the select line; and
        (2) a gate terminal coupled to a control line; and
    (B) a p-channel transistor having a p-substrate, and having
        (1) a source terminal coupled to a first power line which selectively supplies one of a first voltage level and a second voltage level;
        (2) a drain terminal coupled to the drain terminal of the n-channel transistor;
        (3) a gate terminal coupled to the gate terminal of the n-channel transistor and the control line, such that when a control signal is delivered on the control line, the p-channel transistor transfers the voltage level supplied on the first power line to the select line; and
        (4) an n-well coupled to the p-substrate and a second power line, the second power line being at a constant voltage level, such that when the first power line switches from supplying the first voltage level to the second voltage level, a diffusion junction capacitance between the n-well and the p-substrate is kept substantially at a constant charge.

2. The fast driver of claim 1, wherein the voltage level supplied by the second power line is always greater than or equal to the voltage level supplied by the first power line.

3. The fast driver of claim 1, wherein the select line is a word line of the memory array and said driver drives a voltage on the word line to select a particular row or column of the memory array.

4. The fast driver of claim 3, wherein the memory array comprises a flash memory array and said driver drives a voltage on the word line having the first voltage level for programming the flash memory array, and drives a voltage on the word line having the second voltage level for performing a program verify of the flash memory array.

5. A method of selecting a memory cell in a flash memory, comprising the steps of:
    (A) asserting a control signal on a control line, the control signal corresponding to an address of the memory cell;
    (B) activating a driver in response to the control signal, the driver including an n-channel transistor, having a gate terminal, coupled in series with a p-channel transistor, the p-channel transistor having an n-well, a p-substrate, a source terminal coupled to a first power line, a drain terminal coupled to a drain terminal of the n-channel transistor and a select line, and a gate terminal coupled to the gate terminal of the n-channel transistor and the control line;
    (C) driving the select line with a voltage from the first power line by transferring the voltage from the first power line to the select line, wherein the voltage is one of a first voltage level, designating a programming operation for the flash memory, and a second voltage level, designating a verify operation for the flash memory;
    (D) keeping a diffusion junction capacitance between the n-well and the p-substrate of the p-channel transistor at a constant charge by coupling a second power line to the n-well, wherein a voltage level of the second power line remains constant when the first power line switches from supplying the first voltage level to the second voltage level; and
    (E) selecting the memory cell, coupled to the select line, when the select line is driven with one of the first voltage level and the second voltage level.

\* \* \* \* \*

UNITED STATES PATENT AND TRADEMARK OFFICE
CERTIFICATE OF CORRECTION

PATENT NO.    :  5,506,803
DATED         :  April 9, 1996
INVENTOR(S)   :  Bowers et al.

It is certified that error appears in the above-identified patent and that said Letters Patent is hereby corrected as shown below:

In column 8 at line 62 delete "potion" and insert --portion--

In column 3 at line 63 delete "a"

In column 8 at line 41 delete "and 59a"

Signed and Sealed this

Nineteenth Day of August, 1997

Attest:

BRUCE LEHMAN

Attesting Officer         Commissioner of Patents and Trademarks